US009113583B2

(12) United States Patent
Shaddock et al.

(10) Patent No.: US 9,113,583 B2
(45) Date of Patent: Aug. 18, 2015

(54) ELECTRONIC CIRCUIT BOARD, ASSEMBLY AND A RELATED METHOD THEREOF

(75) Inventors: David Mulford Shaddock, Troy, NY (US); Emad Andarawis Andarawis, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/563,132

(22) Filed: Jul. 31, 2012

(65) Prior Publication Data

US 2014/0036463 A1 Feb. 6, 2014

(51) Int. Cl.
*H05K 1/00* (2006.01)
*H05K 3/28* (2006.01)

(52) U.S. Cl.
CPC ...... *H05K 3/282* (2013.01); *H01L 2224/16225* (2013.01); *H05K 2203/1194* (2013.01)

(58) Field of Classification Search
CPC ........... H05K 1/00; H05K 1/032; H05K 1/03; H05K 1/0209; H01L 23/28
USPC .......................................... 174/252; 361/706
See application file for complete search history.

(56) References Cited

U.S. PATENT DOCUMENTS

| | | | |
|---|---|---|---|
| 4,140,817 A | 2/1979 | Brown | |
| 4,633,035 A | 12/1986 | McMonagle | |
| 4,859,805 A * | 8/1989 | Kawakami et al. | ........... 174/252 |
| 5,012,387 A | 4/1991 | Ohlenburger | |
| 5,155,665 A | 10/1992 | Komorita et al. | |
| 5,164,884 A * | 11/1992 | Pesola | ........................... 361/717 |
| 5,273,775 A | 12/1993 | Dyer et al. | |
| 5,430,258 A | 7/1995 | Hoshino | |
| 5,913,147 A | 6/1999 | Dubin et al. | |
| 6,037,257 A | 3/2000 | Chiang et al. | |
| 6,452,264 B2 * | 9/2002 | Nishide et al. | ................ 257/703 |
| 2003/0112605 A1 | 6/2003 | Hable | |
| 2005/0097941 A1 * | 5/2005 | Sandvik et al. | ............. 73/31.06 |
| 2005/0276958 A1 | 12/2005 | Komurasaki et al. | |
| 2006/0118905 A1 * | 6/2006 | Himori et al. | ................. 257/531 |

(Continued)

FOREIGN PATENT DOCUMENTS

JP 2008098511 A 4/2008

OTHER PUBLICATIONS

Takasago et al., "Advanced Copper/Polyimide Hybrid Technology", IEEE Transactions on Components, Hybrids, and Manufacturing Technology, vol. 10, Issue 3, pp. 425-432, Sep. 1987.

(Continued)

*Primary Examiner* — Tuan T Dinh
*Assistant Examiner* — Steven T Sawyer
(74) *Attorney, Agent, or Firm* — John P. Darling

(57) ABSTRACT

An apparatus includes a substrate and a plurality of conductive traces formed on the substrate. The conductive traces are doped with a concentration of an aluminum material forming a protective layer as a portion of the plurality of conductive traces to inhibit oxidation. A set of first metal contact pads are formed in contact with the plurality of conductive traces. The substrate, the plurality of conductive traces and the set of first metal contact pads define an electronic circuit board configured to operate at a temperature greater than 200 degrees Celsius. A high operating temperature electronic device is configured in electrical communication with the conductive traces defining an assembly configured to operate at a temperature greater than 200 degrees Celsius.

24 Claims, 4 Drawing Sheets

(56) References Cited

U.S. PATENT DOCUMENTS

| | | |
|---|---|---|
| 2007/0181993 A1 | 8/2007 | Choi et al. |
| 2008/0145518 A1* | 6/2008 | Maeda et al. .................. 427/58 |
| 2008/0284542 A1* | 11/2008 | Sano et al. .................. 333/187 |
| 2009/0056996 A1* | 3/2009 | Kato et al. .................. 174/260 |
| 2009/0107699 A1* | 4/2009 | Ryu .............................. 174/250 |
| 2009/0166864 A1* | 7/2009 | Pang et al. .................. 257/751 |
| 2010/0307802 A1 | 12/2010 | Yamamoto et al. |
| 2011/0147753 A1 | 6/2011 | Onishi et al. |
| 2012/0125670 A1* | 5/2012 | Kato et al. .................. 174/257 |

OTHER PUBLICATIONS

European Search Report and Written Opinion issued in connection with corresponding EP Application No. 13178629.5-1803 dated Dec. 16, 2013.

Ding et al., "Effects of the Addition of Small Amounts of Al to Copper: Corrosion, Resistivity, Adhesion, Morphology, and Diffusion", Journal of Applied Physics, vol. No. 75, Issue No. 7, pp. 3627-3631, Apr. 1, 1994.

\* cited by examiner

ELECTRONIC CIRCUIT BOARD, ASSEMBLY AND A RELATED METHOD THEREOF

BACKGROUND

Embodiments presented herein relate generally to electronic circuit board assemblies, and more specifically to an electronic circuit board capable of high temperature operation and a related method thereof.

A printed circuit board (referred to as "PCB") is often used to mechanically support and electrically connect electronic components using conductive pathways, tracks or signal traces that may be etched from metal sheets laminated onto a non-conductive substrate. A PCB populated with electronic components is a printed circuit assembly and may also be referred to as a printed circuit board assembly (PCBA).

Conventional conducting layers of the PCB are typically made of thin copper foil. The vast majority of printed circuit boards are made by bonding a layer of copper over the entire substrate, sometimes on both sides, then removing unwanted copper in a subtractive processing technique after applying a temporary mask (e.g. by etching), leaving only the desired copper traces. Some PCBs are made by adding traces to the bare substrate, in an additive processing technique, usually by multiple electroplating steps. The copper material commonly used for these conducting traces has low resistivity and costs, but easily oxidizes with a resultant increase in resistance, which decreases its reliability. In addition, this type of conventional PCB may be limited to applications at a temperature below 200 degrees Celsius.

High temperature PCBs typically use noble metals to form the traces, or conductors, on ceramic substrates to interconnect circuit elements. More particularly, many high temperature (above 200 degrees Celsius) operation PCBs use thick film gold (Au) or silver (Ag) films. These types of films are used due to their inherent low resistivity and minimal oxidation. However, these precious metals are expensive to use. Thin films of gold (Au) or silver (Ag) have been used, however they require sufficient barrier and adhesion layers to prevent intermixing with the precious metal at high temperature.

Irrespective of the operating temperature, after the PCB is completed, electronic components are attached to form a functional printed circuit assembly. In a surface-mount technique, the components are placed on pads on the outer surfaces of the PCB and in electrical contact with the conductive traces. The component leads may be electrically and mechanically fixed to the board with a molten metal solder.

In light of the above, it is desired to provide an improved electronic circuit device capable of withstanding high temperature operations, while maintaining low cost manufacture.

BRIEF SUMMARY

These and other shortcomings of the prior art are addressed by the present disclosure, which provides an improved electronic circuit board, circuit board assembly and method of fabricating. The electronic circuit board and assembly are configured to benefit from a novel interconnect solution wherein low cost conductors having resistance to oxidation are utilized and result in an improved circuit board and assembly capable of withstanding high temperature operation.

In accordance with an exemplary embodiment of the present disclosure, an apparatus includes a substrate; a plurality of conductive traces formed on the substrate, and a set of first metal contact pads in contact with the plurality of conductive traces. The plurality of conductive traces comprising a conductive material doped with a concentration of an aluminum material to form a protective layer as a portion of the plurality of conductive traces to inhibit oxidation. The substrate, the plurality of conductive traces and the set of first metal contact pads defining an electronic circuit board configured to operate at a temperature greater than 200 degrees Celsius.

In accordance with an exemplary embodiment of the present disclosure, a method includes providing a substrate; co-depositing a copper (Cu) material and an aluminum (Al) material to form a coating layer on an uppermost surface of the substrate; patterning the coating layer of the copper (Cu) material and the aluminum (Al) material to form a plurality of conductive traces on the substrate; masking portions of the plurality of conductive traces to provide a plurality of electrical connections; annealing the plurality of conductive traces to provide migration of the aluminum (Al) material to a surface of the plurality of conductive traces; and exposing the plurality of conductive traces to air to oxidize the migrated aluminum (Al) material and form an alumina protective layer on a surface of the remaining copper (Cu) material.

Other objects and advantages of the present disclosure will become apparent upon reading the following detailed description and the appended claims with reference to the accompanying drawings.

BRIEF DESCRIPTION OF THE FIGURES

The above and other features, aspects, and advantages of the present disclosure will become better understood when the following detailed description is read with reference to the accompanying drawings in which like characters represent like parts throughout the drawings, wherein.

DETAILED DESCRIPTION

According to embodiments presented herein, an apparatus, for example, an electronic circuit board, assembly and a related method thereof is disclosed. In an embodiment, the electronic circuit board includes a substrate. The electronic circuit board further includes a plurality of conductor traces to interconnect circuit elements. The circuit board, and more particularly, the conductor traces are fabricated to withstand high temperature operation. A set of first metal contact pads can be disposed on the substrate. An electronic circuit board, and more particularly at least the substrate, the plurality of conductive traces and the metal contact pads, configured as described herein may be capable of operating at a temperature greater than 200 degrees Celsius, may demonstrate enhanced resistance to failure due to extreme conditions such as high temperature, vibration, and corrosion, and may provide low losses, for example, low inductance, and low resistance. In an embodiment, the electronic circuit board, and more particularly at least the substrate, the plurality of conductive traces and the metal contact pads, configured as described herein may be capable of operating at a temperature greater than 260 degrees Celsius, and more particularly enabling operation at temperatures where known degradation of metals, such as, copper on polymer, occurs. In an embodiment, the electronic circuit board, and more particularly at least the substrate, the plurality of conductive traces and the metal contact pads, configured as described herein may be capable of operating at a temperature greater than 350 degrees Celsius, and more particularly enabling operation at temperatures where known degradation of metals, such as, nickel plated copper-, occurs.

Figure 1:
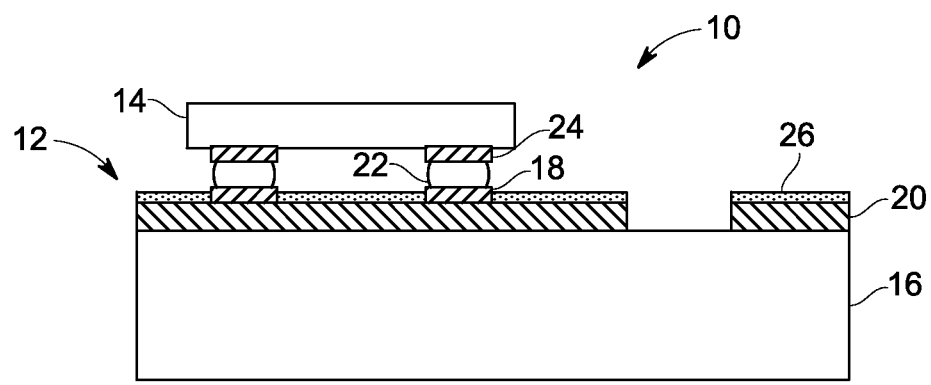
FIG. 1 is a diagrammatical representation of an assembly, for example an electronic circuit board assembly for a high temperature operating device in accordance with an embodiment.

Referring to FIG. 1, therein is illustrated, an apparatus, for example specifically referred to as an electronic circuit board assembly 10 including an electronic circuit board 12, such as a printed circuit board (PCB), in accordance with an embodiment and having coupled thereto a high operating temperature electronic device 14 in accordance with an embodiment. In an embodiment, the apparatus may be configured to include a printed wiring board (PWB). In an embodiment, the PCB or PWB and the high operating temperature electronic device may form a printed circuit assembly (PCA), or a printed circuit board assembly (PCBA).

In an embodiment, the illustrated electronic circuit board 12 includes a substrate 16, and a set of first metal contact pads 18 in contact with a plurality of conductive traces 20 disposed on the substrate 16. The substrate 16 may be formed of any material capable of withstanding high-temperature operation. In an embodiment, the substrate 16 is formed of ceramic, such as aluminum oxide, aluminum nitride, silicon nitride or similar type ceramic material. The set of first metal contact pads 18 includes at least one of gold (Au), platinum (Pt), aluminum (Al), nickel (Ni), or silver (Ag) contact pads and a diffusion barrier layer of tantalum (Ta) or titanium tungsten (TiW) to prevent intermixing of the contact metal and conductor metal. The electronic circuit board assembly 10 may also include a plurality of metal bumps 22, each metal bump among the plurality of metal bumps 22 may be coupled to a corresponding first metal contact pad among the set of first metal contact pads 18. The plurality of metal bumps 22 includes at least one of gold (Au), platinum (Pt), aluminum (Al), nickel (Ni), copper (Cu) or a composite of copper (Cu) and aluminum (Al) bumps. In some embodiments, the plurality of metal bumps 22 may include metal stud bumps. The electronic circuit board assembly 10 may further include a set of second metal contact pads 24 disposed on the high operating temperature electronic device 14. Each metal bump among the plurality of metal bumps 22 may be coupled to a corresponding second metal contact pad among the set of second metal contact pads 24. The set of second metal contact pads 24 includes at least one of gold (Au), platinum (Pt), aluminum (Al), nickel (Ni), or copper (Cu) contact pads.

In an embodiment, the plurality of novel conductive traces 20 are formed according to the method described herein. More specifically, during fabrication, the conductive traces 20 are doped with low concentrations of aluminum, generally on the order of 1%-5% per volume. This doping has been shown to form a protective layer 26 as an uppermost surface of the conductive traces 20 that is capable of inhibiting oxidation of the underlying conductive trace material. In an embodiment, the resultant plurality of conductive traces 20 are formed of a copper (Cu) material having the protective layer 26 formed as a portion thereof.

Figure 2:
FIG. 2 is a diagrammatical representation of a step in the method of fabricating the electronic circuit board assembly of FIG. 1 in accordance with an embodiment.
Figure 3:
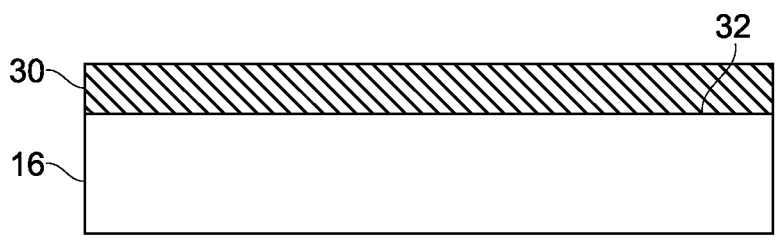
FIG. 3 is a diagrammatical representation of a step in the method of fabricating the electronic circuit board assembly of FIG. 1 in accordance with an embodiment.
Figure 4:
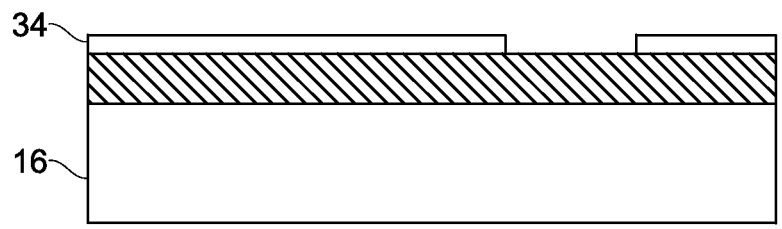
FIG. 4 is a diagrammatical representation of a step in the method of fabricating the electronic circuit board assembly of FIG. 1 in accordance with an embodiment.
Figure 5:
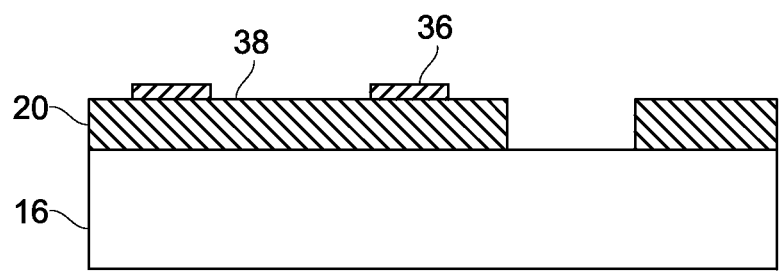
FIG. 5 is a diagrammatical representation of a step in the method of fabricating the electronic circuit board assembly of FIG. 1 in accordance with an embodiment.
Figure 6:
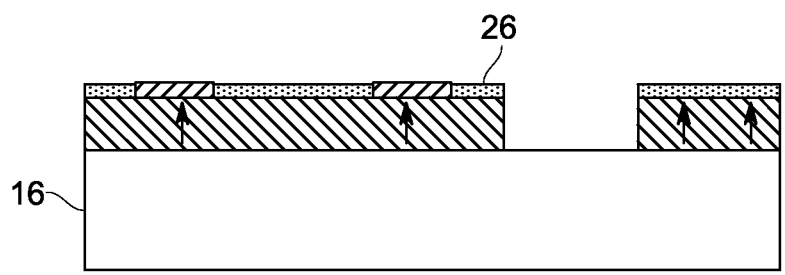
FIG. 6 is a diagrammatical representation of a step in the method of fabricating the electronic circuit board assembly of FIG. 1 in accordance with an embodiment.
Figure 7:
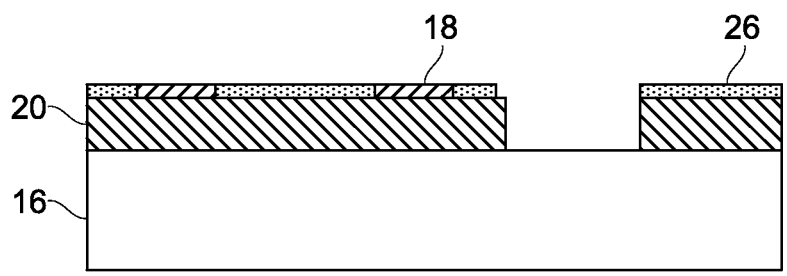
FIG. 7 is a diagrammatical representation of a step in the method of fabricating the electronic circuit board assembly of FIG. 1 in accordance with an embodiment.

Referring more particularly to FIGS. 2-7, illustrated in diagrammatical representations are steps in a method of fabricating an electronic circuit board assembly 10 according to an exemplary embodiment. More particularly, illustrated in FIG. 2 is a first step including providing the substrate 16, of a material generally similar to those previously described. FIG. 3 illustrates the co-depositing of a copper (Cu) material and an aluminum (Al) material as a coating layer 30 on an uppermost surface 32 of the substrate 16. Next, as best illustrated in FIG. 4, a masking material 34, such as a photoresist that is exposed with a circuit image and developed, acts as an etch resist during a subtractive etch process. Alternatively, and as previously described, the plurality of conductive traces 20 may be formed during an additive processing technique or by applying the masking layer before conductor deposition and use a lift off process. FIG. 5 illustrates the positioning of a contact material 36, such as silver (Ag), nickel (Ni) or gold (Au), on a surface 38 of a portion of the conductive traces 20 to allow for fabrication of the set of first metal contact pads 18. The contact material 36 may contain layers that include an adhesion layer and diffusion barrier to prevent interdiffusion of the conductive trace material with the outer contact material. During an annealing step (described presently), as best illustrated in FIG. 6, the aluminum (Al) material contained within the now patterned coating layer 30 migrates to a surface 38 of the plurality of conductive traces 20 forming the protective layer 26 on portions of the conductive traces 20. Experimental data has shown a protective layer 26 having a thickness in a range of 1 nm to 1 mm. In an embodiment, the protective layer 26 is formed having a preferred thickness of 5 nm. Finally, as best illustrated in FIG. 7, the set of first metal contact pads 18 are in electrical communication with a portion of the conductive traces 20.

Figure 8:
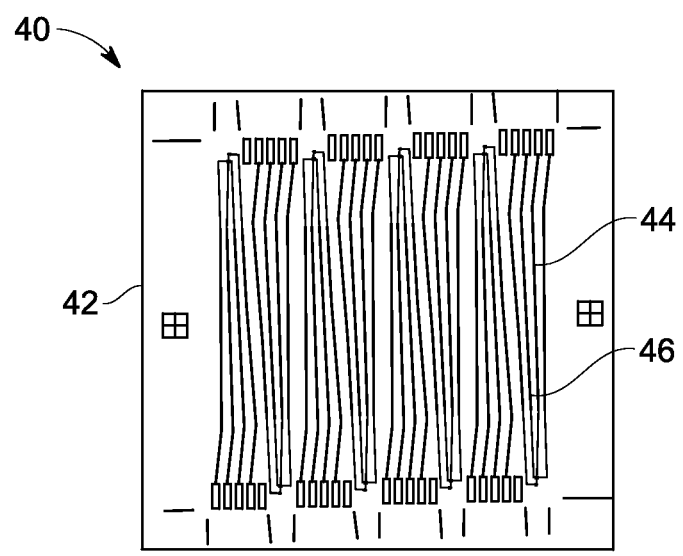
FIG. 8 is a top view of an exemplary electronic circuit board assembly in accordance with an embodiment.
Figure 9:
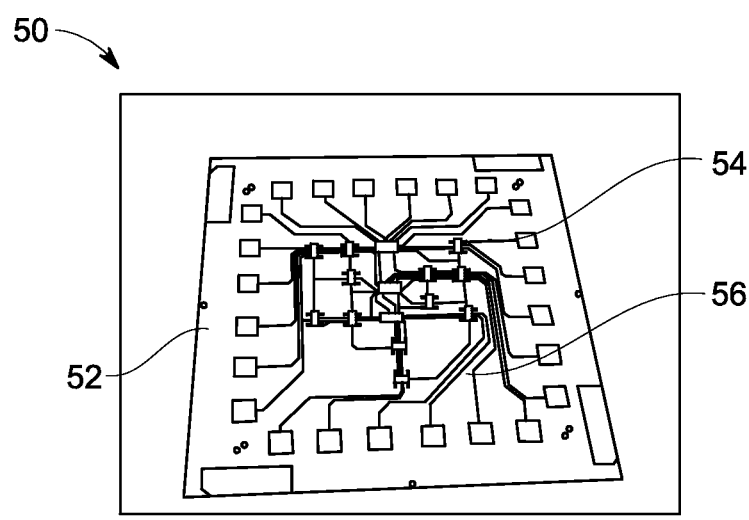
FIG. 9 is a top view of another exemplary electronic circuit board assembly in accordance with an embodiment.

FIGS. 8 and 9 illustrate top views of exemplary electronic circuit board assemblies in accordance with embodiments disclosed herein. More specifically, FIG. 8 illustrates an electronic circuit board assembly 40, fabricated generally similar to the electronic circuit board assembly 10 of FIGS. 1-7. The electronic circuit board assembly 40 is illustrated including a substrate 42, generally similar to substrate 16 of FIGS. 1-7, having formed thereon a plurality of conductive traces 44, generally similar to the plurality of conductive traces 20 of FIGS. 1-7. The plurality of conductive traces 44 comprising a conductive material doped with a concentration of an aluminum material to form a protective layer 46 as a portion of the plurality of conductive traces 44 to inhibit oxidation. In an embodiment the apparatus, and more particularly at least the substrate 16 and plurality of conductive traces 44, is configured to operate at a temperature greater than 200 degrees Celsius. In an embodiment, the apparatus, and more particularly at least the substrate 16 and plurality of conductive traces 44, is configured to operate at a temperature greater than 260 degrees Celsius.

FIG. 9 illustrates another embodiment of an electronic circuit board assembly 50, fabricated generally similar to the electronic circuit board assembly 10 of FIGS. 1-7. The electronic circuit board assembly 50 is illustrated including a substrate 52, generally similar to substrate 16 of FIGS. 1-7, having formed thereon a plurality of conductive traces 54, generally similar to the plurality of conductive traces 20 of FIGS. 1-7. The plurality of conductive traces 54 comprising a conductive material doped with a concentration of an aluminum material to form a protective layer 56 as a portion of the plurality of conductive traces 54 to inhibit oxidation. The apparatus, and more particularly at least the substrate 52 and plurality of conductive traces 54, is configured to operate at a temperature greater than 200 degrees Celsius.

Figure 10:
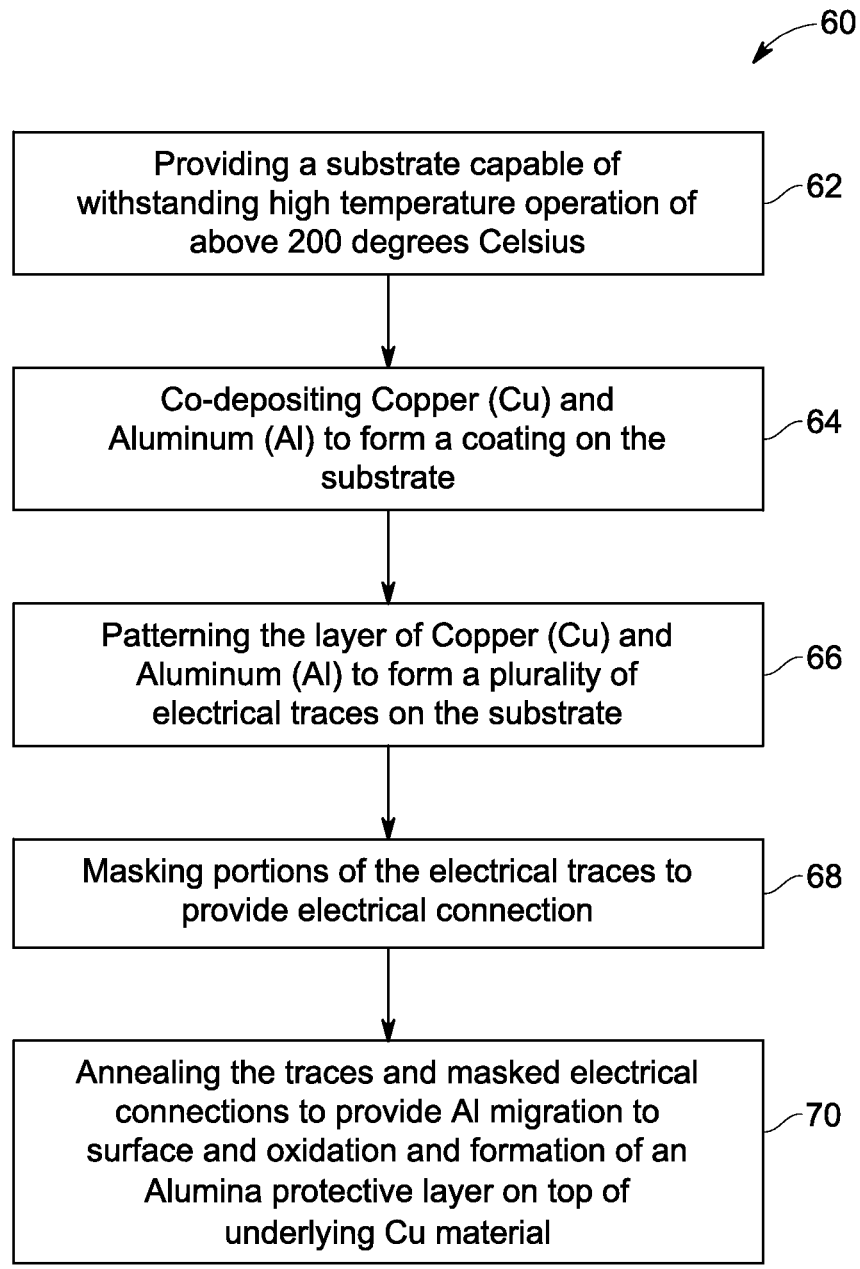
FIG. 10 is a schematic block diagram of a method for fabricating an electronic circuit board assembly in accordance with an embodiment.

Referring now to FIG. 10, illustrated in a schematic block diagram is of method 60 for fabricating an electronic circuit board assembly according to an exemplary embodiment. As illustrated, in a first step 62, a substrate, generally similar to the substrate 16 of FIG. 1, is provided. In an embodiment, the substrate is formed of a ceramic material. Next, in step 64, a plurality of conductive traces are formed by co-depositing a copper (Cu) material and an aluminum (Al) material to form a coating layer on the substrate. In an embodiment, the co-depositing of the copper (Cu) material and the aluminum (Al) material is on an uppermost surface of the substrate, but in an alternative embodiment may be conducted on opposed upper and lower surfaces of the substrate. More specifically, disclosed is a method in which the copper (Cu) material and the aluminum (Al) material are co-sputtered onto at least one surface of the substrate to form the at least one coating layer on the substrate. Alternatively, a copper/aluminum alloy is deposited onto at least one surface of the substrate to form at least one coating layer on the substrate.

In a further step 66, the deposited coating layer is patterned to form the plurality of conductive traces 20 on the substrate 16. Patterning the deposited coating layer to form the conductive traces 20 may be accomplished through well-known processing techniques, such as known subtractive processing techniques utilizing photoresist. At a step 68, areas for electrical connections, such as for the set of first metal contact pads, are masked or otherwise coated to protect them from subsequent processing steps. Coating materials may include, but are not limited to, nickel (Ni), silver (Ag), gold (Au), or the like. The device next undergoes an annealing process, at step 70. More specifically, the device is subject to an annealing process in which the coating layer is annealed in a vacuum or forming gas at approximately 300-400 degrees Celsius, for approximately one hour to allow for the aluminum (Al) material to migrate to the surface. This migration of the aluminum (Al) material forms an alumina passivation or protective layer, such a protective layer 26 (FIG. 1).

The step of annealing utilizing a forming gas aids in the reduction of any native oxide on the surface of the coating layer and grain boundaries, allowing the aluminum (Al) to migrate to the surface. Upon exposure to air, the migrated aluminum (Al) forms the alumina passivation, or protective, layer which is a dielectric and capable of protecting the underlying copper from oxidation. Experimental samples including Cu5% Al, annealed at 400 degrees Celsius in forming gas have shown stable resistance for >500 hours at 300 degrees Celsius in air.

To complete fabrication of the electronic circuit board assembly 10, the first set of metal contact pads 18 may be formed in contact with the conductive traces 20. The plurality of metal bumps 22 may be bonded to the set of first metal contact pads 18 and the set of second metal contact pads 24 via a diffusion bonding. Diffusion bonding involves holding pre-machined components under load at an elevated temperature, possibly in a protective atmosphere or vacuum. In another embodiment, the plurality of metal bumps 22 may be bonded to the set of first metal contact pads 18 and the set of second metal contact pads 24 via a thermo-compression bonding, i.e. by the application of pressure and heat in the absence of an electrical current. In yet another embodiment, the plurality of metal bumps 22 may be bonded to the set of first metal contact pads 28 and the set of second metal contact pads 24 via a thermo-sonic bonding i.e. bonding by using a combination of heat, ultrasonic energy, and pressure generally applied by a bonding tool. In yet another embodiment, the high operating temperature electronic device 14 may be coupled to the electronic circuit board 12 utilizing well known coupling techniques known in the art.

It should be noted herein that the electronic circuit board 12 is applicable for interconnecting the high operating temperature electronic device 14 operated at temperatures above 200 degrees Celsius.

As mentioned above the electronic circuit board 12 is applicable for a high operating temperature electronic device 14 operated at temperature above 200 degrees Celsius. In one embodiment, the high operating temperature electronic device 14 may be a nitrogen oxide sensor. In another embodiment, the high operating temperature electronic device 14 may be a drilling device, such as a drilling device for oil and/or gas. In yet another embodiment, the high operating temperature electronic device 14 may be a digital sensing device. In yet another embodiment, the high operating temperature electronic device 14 may be for an automobile. In a further embodiment, the high operating temperature electronic device 14 may be for a jet engine, or a turbine. It should be noted that the list mentioned herein is not all inclusive and the board may also be applicable for other applications operated above 200 degrees Celsius.

In the exemplary embodiments discussed herein, the electronic circuit board assembly 10 has enhanced temperature capability, i.e. applicable for high operating temperature electronic device 14 operated at temperatures above 200 degrees Celsius, and more particularly above 260 degrees Celsius. In an embodiment, the electronic circuit board 12, and more particularly at least the substrate 16 and plurality of conductive traces 44, have enhanced temperature capability, i.e. applicable for high operating temperature above 200 degrees Celsius, and more particularly above 260 degrees Celsius. The exemplary electronic circuit board assembly 10 is resistant to the harsh environment (for example, temperature, vibration, corrosion) and provides a low loss (for example, low inductance, low resistance). The apparatus may be configured as a printed circuit board (PCB), a printed wiring board (PWB), a printed circuit assembly (PCA), or a printed circuit board assembly (PCBA).

The various embodiments of the exemplary circuit board assembly described hereinabove provide low cost conductors having resistance to oxidation and result in an improved circuit board and assembly capable of withstanding high temperature operation. Additionally, the exemplary circuit board is capable of withstanding high temperature operations, while maintaining low cost of manufacture.

It is understood that not necessarily all such objects or advantages described above may be achieved in accordance with any particular embodiment. Thus, for example, those skilled in the art will recognize that the systems and techniques described herein may be embodied or carried out in a manner that achieves or optimized one advantage or group of advantages as taught herein without necessarily achieving other objects or advantages as may be taught or suggested herein.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The foregoing has described a novel electronic circuit board, circuit board assembly and method of fabricating the same. While the present disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out the disclosure. It is, therefore, to be understood that the appended claims are intended to cover all such modifications and changes as fall within the true spirit of the disclosure.

The invention claimed is:

1. An apparatus comprising: a substrate, wherein the substrate comprises a ceramic material; a plurality of conductive traces formed on the substrate, the plurality of conductive traces comprising a co-deposited conductive material doped with 1-5% by volume of an aluminum material that is annealed to form a protective layer on selective portions of a surface of the conductive traces, the protective layer having a thickness of less than approximately 500 nm to inhibit oxidation; and
   a set of first metal contact pads in contact with the surface of the plurality of conductive traces and in electrical communication with the plurality of conductive traces,
   wherein the substrate, the plurality of conductive traces and the set of first metal contact pads define an electronic ceramic circuit board configured to operate at a temperature between 200 and 1130 degrees Celsius.

2. The apparatus of claim 1, wherein the substrate, the plurality of conductive traces and the set of first metal contact pads define an electronic ceramic circuit board configured to operate at a temperature greater than 260 degrees Celsius.

3. The apparatus of claim 1, wherein the substrate, the plurality of conductive traces and the set of first metal contact pads define an electronic ceramic circuit board configured to operate at a temperature greater than 350 degrees Celsius.

4. The apparatus of claim 1, wherein the substrate comprises at least one of aluminum oxide, aluminum nitride or silicon nitride.

5. The apparatus of claim 1, wherein the plurality of conductive traces comprise a copper material.

6. The apparatus of claim 1, wherein the protective layer comprises alumina.

7. The apparatus of claim 1, wherein the set of first metal contact pads comprises at least one of gold (Au), platinum (Pt), aluminum (Al), silver (Ag) or nickel (Ni).

8. The apparatus of claim 1, further comprising a high operating temperature electronic device coupled to the set of first metal contact pads.

9. The apparatus of claim 8, wherein the high operating temperature electronic device is operated at a temperature greater than 200 degrees Celsius.

10. The apparatus of claim 8, wherein the high operating temperature electronic device comprises at least one of a nitrogen oxide sensor, an oil and gas drilling device, a digital sensing device, an automobile, a jet engine, or a turbine.

11. The apparatus of claim 10, wherein the electronic ceramic circuit board and the high operating temperature electronic device define a printed circuit assembly (PCA) or a printed circuit board assembly (PCBA) configured to operate at a temperature greater than 200 degrees Celsius.

12. A method, comprising: providing a substrate;
   co-depositing a copper (Cu) material doped with 1-5% by volume of an aluminum (Al) material to form a coating layer on an uppermost surface of the substrate;
   patterning the coating layer of the copper (Cu) material and the aluminum (Al) material to form a plurality of conductive traces on the substrate;
   masking portions of the plurality of conductive traces to provide a plurality of electrical connections in contact with a surface of the plurality of conductive traces and in electrical communication with the plurality of conductive traces; annealing the plurality of conductive traces to provide migration of the aluminum (Al) material to the surface of the plurality of conductive traces; and
   exposing the plurality of conductive traces to air to oxidize the migrated aluminum (Al) material and form an alumina protective layer on selective portions of a surface of the remaining copper (Cu) material; wherein the substrate, the plurality of conductive traces and the plurality of electrical connections define an electronic ceramic circuit board configured to operate at a temperature between 200 and 1130 degrees Celsius.

13. The method of claim 12, wherein the substrate, the plurality of conductive traces and the alumina protective layer are configured to operate at a temperature greater than 200 degrees Celsius.

14. The method of claim 12, wherein the substrate, the plurality of conductive traces and the alumina protective layer are configured to operate at a temperature greater than 260 degrees Celsius.

15. The method of claim 12, wherein the substrate, the plurality of conductive traces and the alumina protective layer are configured to operate at a temperature greater than 350 degrees Celsius.

16. The method of claim 12, wherein the substrate comprises a ceramic material.

17. The method of claim 12, wherein co-depositing a copper (Cu) material and an aluminum (Al) material to form a coating layer on an uppermost surface of the substrate includes co-sputtering the copper (Cu) material and the aluminum (Al) material.

18. The method of claim 12, wherein the copper (Cu) material is doped with 1-5% by volume of an aluminum (Al) material.

19. The method of claim 12, wherein the step of annealing the plurality of conductive traces to provide migration of the aluminum (Al) material to a surface of the plurality of conductive traces includes annealing at a temperature of 300-400 degrees Celsius.

20. The method of claim 12, further comprising:
   coupling a high operating temperature electronic device to the set of first metal contact pads to form an assembly; and
   utilizing the assembly at a temperature greater than 200 degrees Celsius.

21. The method of claim 12, wherein the high operating temperature electronic device is operated at a temperature greater than 200 degrees Celsius.

22. The method of claim 12, wherein the assembly is a printed circuit assembly (PCA) or a printed circuit board assembly (PCBA).

23. The method of claim 20, further utilizing the assembly at a temperature greater than 260 degrees Celsius.

24. The method of claim 20, further utilizing the assembly at a temperature greater than 350 degrees Celsius.

* * * * *